United States Patent
Oyama et al.

(10) Patent No.: US 11,553,633 B2
(45) Date of Patent: Jan. 10, 2023

(54) MOUNTING DEVICE, INFORMATION PROCESSING DEVICE, MOUNTING METHOD, AND INFORMATION PROCESSING METHOD

(71) Applicant: FUJI CORPORATION, Chiryu (JP)

(72) Inventors: Shigeto Oyama, Kariya (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 325 days.

(21) Appl. No.: 16/769,408

(22) PCT Filed: Dec. 13, 2017

(86) PCT No.: PCT/JP2017/044783
§ 371 (c)(1),
(2) Date: Jun. 3, 2020

(87) PCT Pub. No.: WO2019/116472
PCT Pub. Date: Jun. 20, 2019

(65) Prior Publication Data
US 2021/0195818 A1   Jun. 24, 2021

(51) Int. Cl.
*H05K 13/04* (2006.01)
*H05K 13/08* (2006.01)

(52) U.S. Cl.
CPC ......... *H05K 13/085* (2018.08); *H05K 13/041* (2018.08); *H05K 13/0882* (2018.08)

(58) Field of Classification Search
CPC . H05K 13/085; H05K 13/0882; H05K 13/041
USPC ........................................................ 700/117
See application file for complete search history.

(56) References Cited

U.S. PATENT DOCUMENTS 10,462,947 B2   10/2019   Ito et al.

FOREIGN PATENT DOCUMENTS

| JP | 2000-165093 A | 6/2000 |
| JP | 2001-24397 A | 1/2001 |
| JP | 2006-253658 A | 9/2006 |
| JP | 6177342 B2 | 8/2017 |

OTHER PUBLICATIONS

JP 2000165093 Translation (Year: 2000).*
International Search Report dated Feb. 6, 2018 in PCT/JP2017/044783 filed Dec. 13, 2017, 2 pages.

* cited by examiner

*Primary Examiner* — Nguyen T Truong
(74) *Attorney, Agent, or Firm* — Oblon, McClelland, Maier & Neustadt, L.L.P.

(57) ABSTRACT

A mounting device comprises: a mounting head having multiple pickup members configured to pick up components; a mounting control section configured to cause a second component to be picked up later when a first component, held by the mounting head at a predetermined height, and the second component, held by the mounting head at a lowered position lower than the predetermined height, are picked up with the mounting head; the mounting control section being configured to cause the second component to be released earlier when the mounting head, having picked up the first component and the second component, releases a component.

8 Claims, 8 Drawing Sheets

MOUNTING DEVICE, INFORMATION PROCESSING DEVICE, MOUNTING METHOD, AND INFORMATION PROCESSING METHOD

TECHNICAL FIELD

This specification discloses a mounting device, an information processing device, a mounting method, and an information processing method.

BACKGROUND ART

Conventionally, a device having a rotary head has been proposed as a mounting device in which multiple pick-up nozzles are circumferentially attached to a rotary body, and while the rotary body rotates, the rotary head picks up components at a first position and a second position (see, for example, Patent Literature 1). Since components can be picked up at multiple positions, throughput is improved with this device.

Patent Literature

Patent Literature 1: U.S. Pat. No. 6,177,342

BRIEF SUMMARY

Technical Problem

However, in the mounting device of Patent Literature 1, picking up a large-sized component, such as interfering with an adjacent pick-up nozzle or a component picked up by an adjacent nozzle, was not considered. In Patent Literature 1, throughput is improved by picking up components at multiple positions, but this is still not sufficient, and there has been a demand to improve the production efficiency when such large components are picked up.

It is an object of the present disclosure to provide a mounting device, an information processing device, a mounting method, and an information processing method capable of further improving production efficiency.

Solution to Problem

The mounting device, the information processing device, the mounting method, and the information processing method disclosed in this specification adopt the following means to achieve the main object described above.

The mounting device disclosed in this specification comprises: a mounting head having multiple pickup members configured to pick up components; a mounting control section configured to cause a second component to be picked up later when a first component, held by the mounting head at a predetermined height, and the second component, held by the mounting head at a lowered position lower than the predetermined height, are picked up with the mounting head; while to cause the second component to be released earlier when the mounting head, having picked up the first component and the second component, releases a component.

This mounting device causes a second component to be picked up later when a first component, held by the mounting head at a predetermined height, and the second component, held by the mounting head at a lowered position lower than the predetermined height, are picked up by the mounting head; and the mounting control section causes the second component to be released earlier when the mounting head, having picked up the first component and the second component, releases a component. In this mounting device, since the second component is held at a lowered position, it is possible to prevent interference with an adjacent pickup member, a first component picked up by an adjacent pickup member, or the like. Therefore, for example, the first component and the second component larger than the first component can be held and moved in the same step. Further, picking up the second component first may interfere with picking up the first component, but here, since the second component is picked up after the first component, the first component and the second component can be picked up without interference. Similarly, picking up a nearby first component while second component is held may cause interference with the second component, but here, since the second component is released preferentially, the first component and the second component can be released without interference. As described above, in this mounting device, since the first component and the second component can be picked up, held, and released without interference, the production efficiency can be further improved. Here, the "predetermined height" and the "lowered position" may be, for example, determined empirically to have heights that do not interfere with other members while components are held. The "pickup member" may be a pick-up nozzle that picks up a component by pressure, or may be a mechanical chuck that grasps and picks up a component.

DESCRIPTION OF EMBODIMENTS

Figure 1:
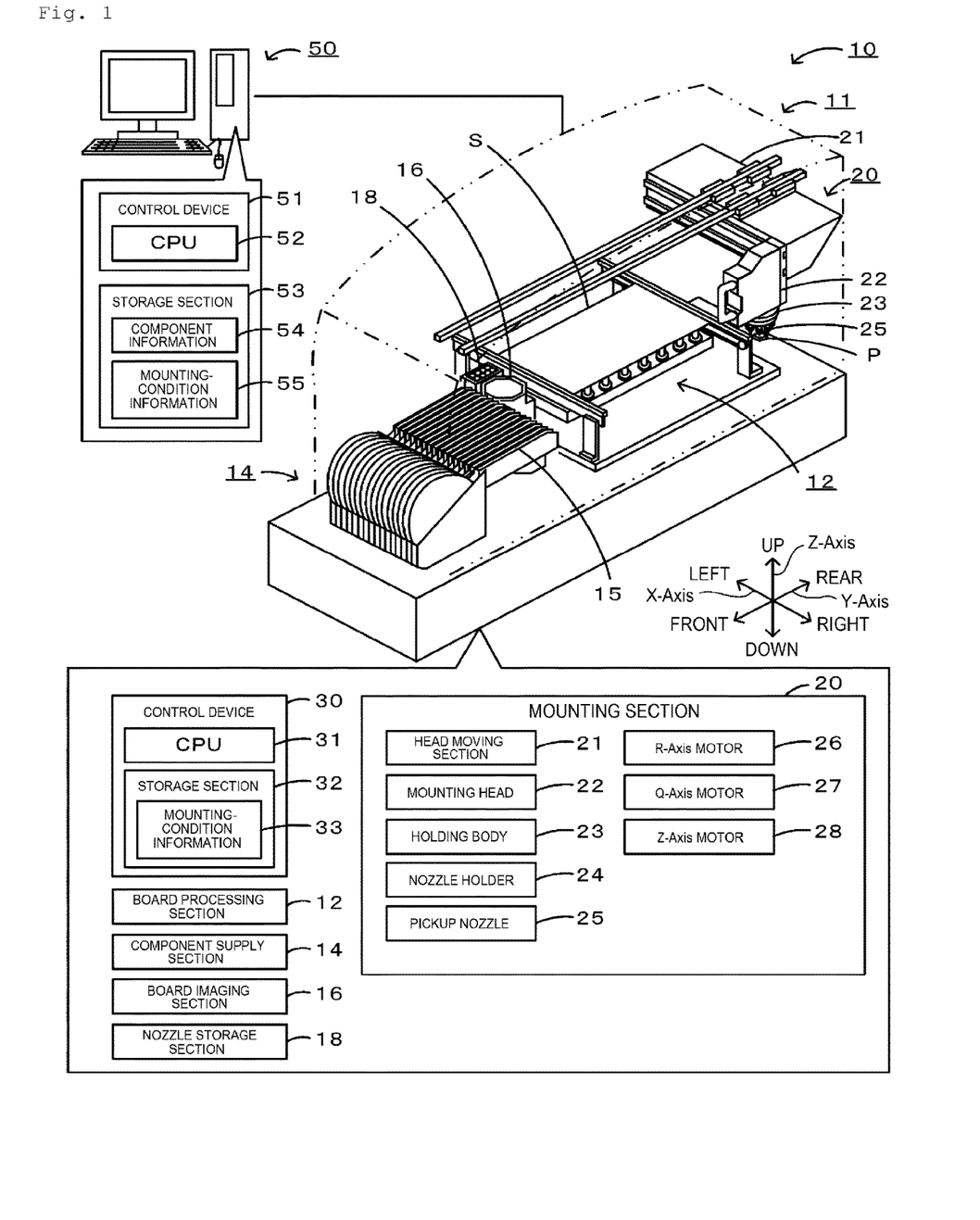
FIG. 1 A schematic diagram showing an example of mounting system 10.
Figure 2:
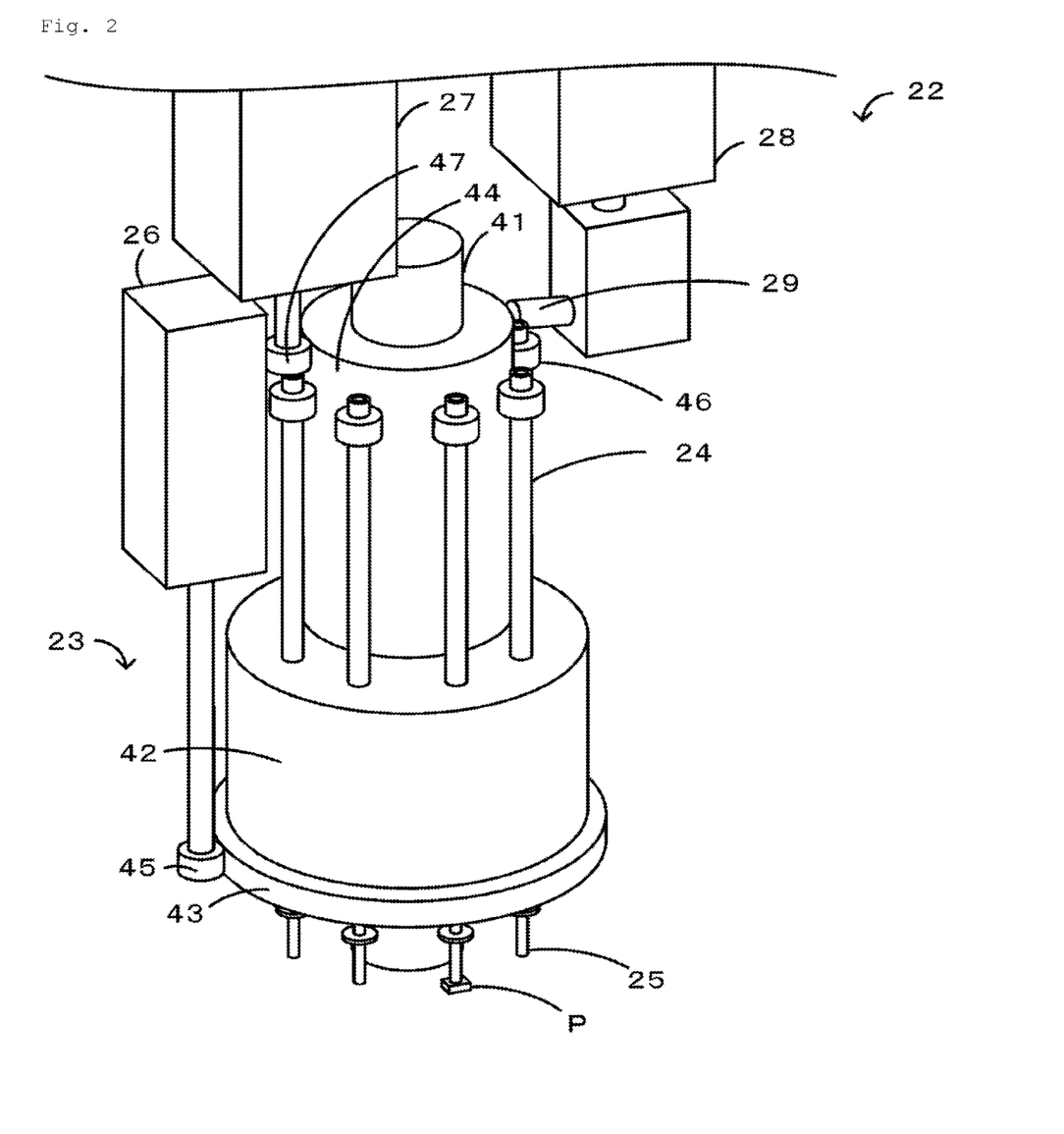
FIG. 2 A diagram of mounting head 22.
Figure 3:
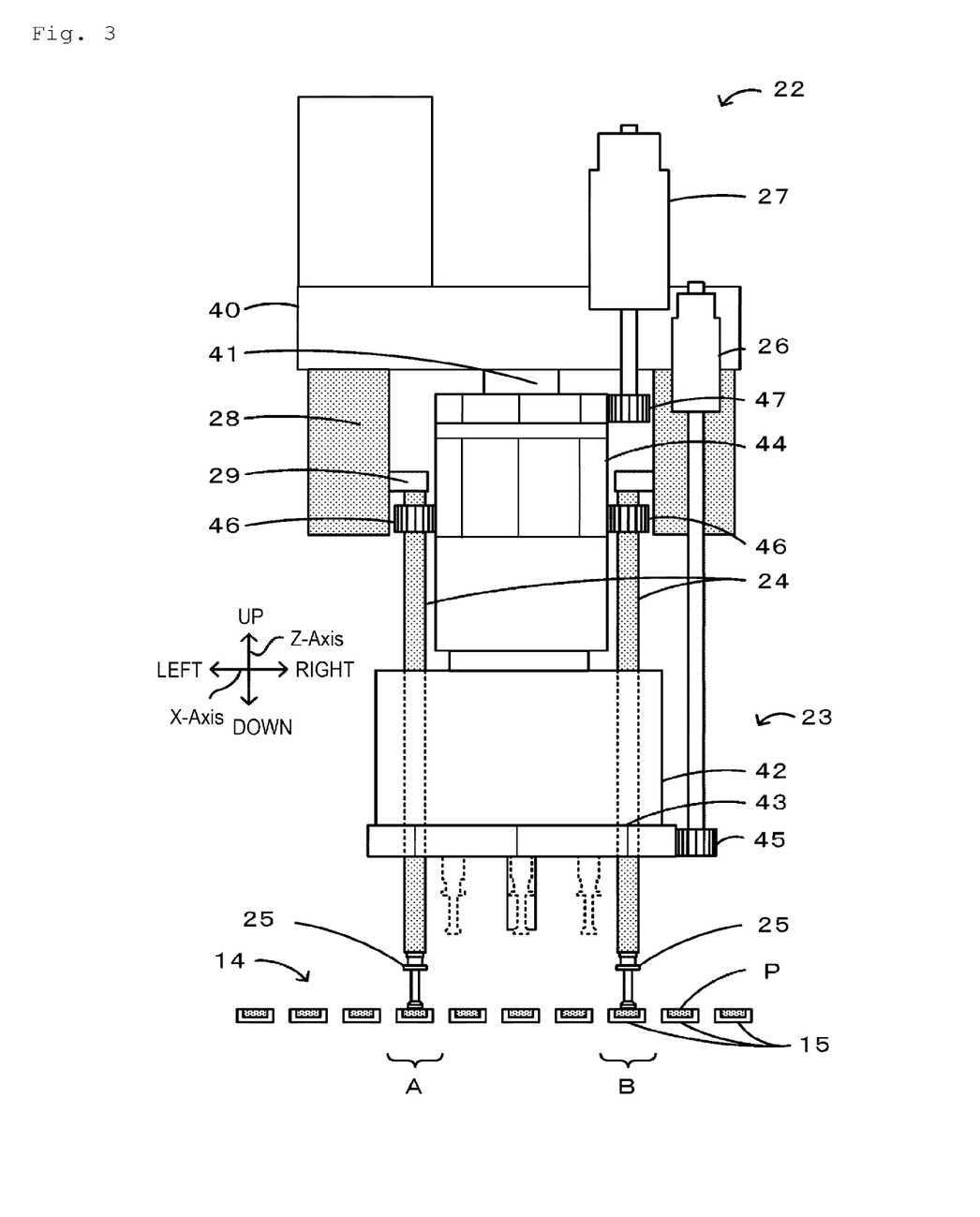
FIG. 3 A diagram showing mounting head 22 collecting components P at the same time.
Figure 4:
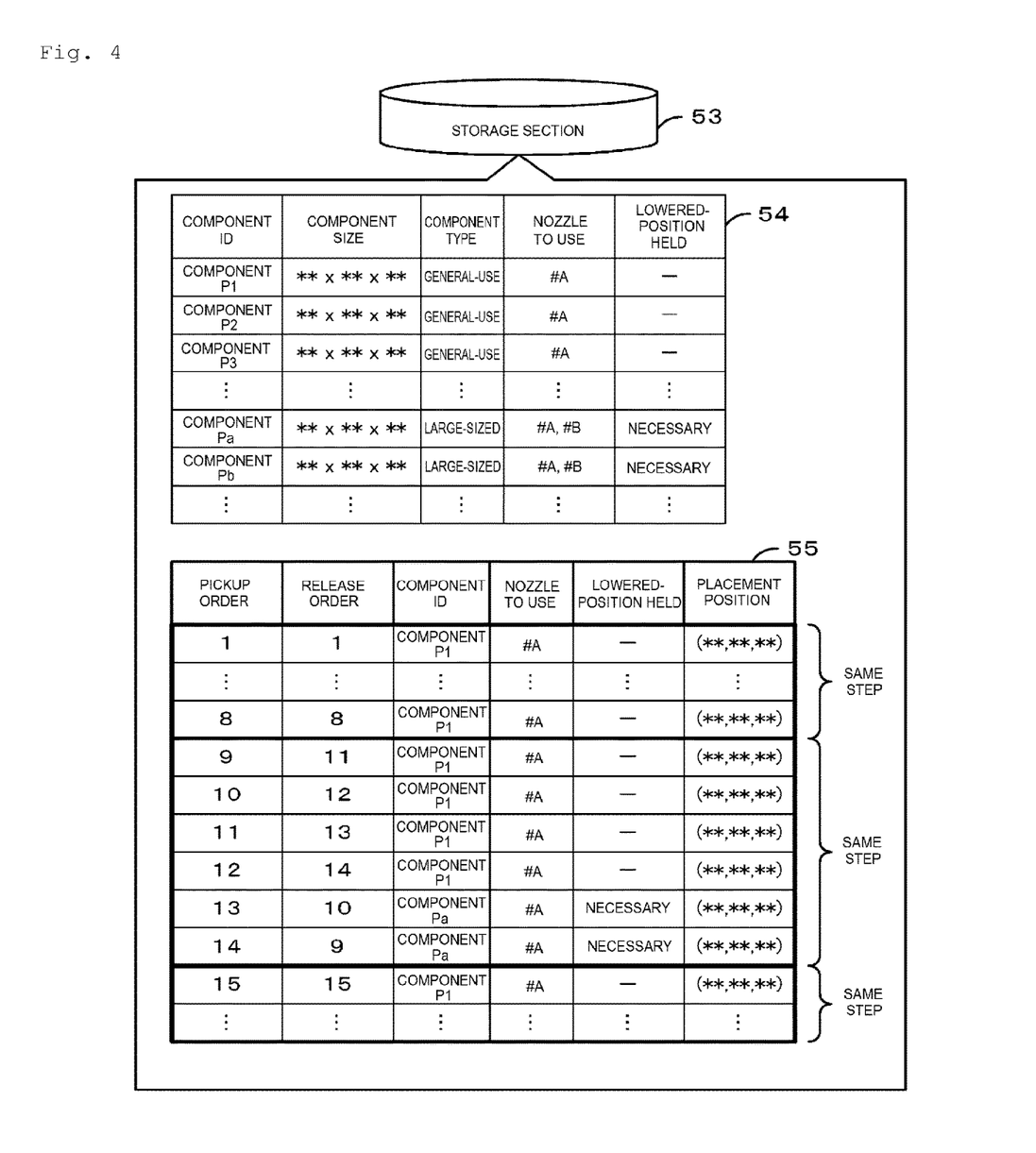
FIG. 4 A figure showing an example of information stored in storage section 53.

The present embodiment will be described below with reference to the drawings. FIG. 1 is a schematic diagram showing an example of mounting system 10 of the present disclosure. FIG. 2 is a diagram of mounting head 22. FIG. 3 is a diagram showing mounting head 22 picking up components P at the same time. FIG. 4 is a figure showing an example of mounting-condition information 33 stored in storage section 53. Mounting system 10 is, for example, a system that executes a mounting process involved in the process of mounting component P on board S. Mounting system 10 includes mounting device 11 and management computer (PC) 50, Mounting system 10 is configured as a mounting line in which multiple mounting devices 11 are arranged from upstream to downstream. In FIG. 1, only one mounting device 11 is shown for convenience of explanation. In the present embodiment, the left-right direction (X-axis), the front-rear direction (Y-axis), and the up-down direction (Z-axis) are as shown in FIGS. 1 and 3, As shown in FIG. 1, mounting device 11 includes board processing section 12, component supply section 14, component imaging section 16, nozzle storage section 18, mounting section 20, and mounting control section 30. Board processing section 12 is a unit for loading, conveying, and fixing board S at a mounting position, and carrying out board S. Board processing section 12 has a pair of conveyor belts suspended in the right-left direction of FIG. 1, spaced apart in the front-rear direction. Board S is conveyed by the conveyor belts.

Component supply section 14 includes multiple feeders 15 having reels and a tray unit, and is detachably attached to the front side of mounting device 11. A tape is wound around each reel, and multiple components P are held on the surface of the tape along the longitudinal direction of the tape. The tape is unwound rearward from the reel and, while the components are exposed, fed by the feeder section to a pickup position where components are picked up by pick-up nozzle 25. The tray section has a tray on which multiple components are arranged and placed, and the tray unit moves the tray in and out of a predetermined pickup position.

Component imaging section 16 is a device for capturing an image, and is a unit for imaging one or more components P picked up and held by mounting head 22. Component imaging section 16 is disposed between component supply section 14 and board processing section 12. The imaging range of component imaging section 16 lies above component imaging section 16. When mounting head 22 holding component P passes over component imaging section 16, component imaging section 16 captures an image thereof and outputs the captured image data to mounting control section 30.

Nozzle storage section 18 stores multiple pick-up nozzles 25 of multiple types in storage holes. Mounting head 22 performs a mounting process by exchanging pick-up nozzles 25 stored in nozzle storage section 18 according to the type of board S on which component P is to be mounted and the type of component P.

Mounting section 20 picks up component P from component supply section 14 and positions component P on board S secured to board processing section 12. Mounting section 20 includes head moving section 21, mounting head 22, holding body 23, nozzle holder 24, and pick-up nozzle 25. Head moving section 21 includes a slider that is guided by guide rails and moves in the XY-direction and a motor that drives the slider. Mounting head 22 is detachably attached to the slider and is moved in the XY direction by head moving section 21. One or more pick-up nozzles 25 are detachably attached to the lower face of mounting head 22 via holding body 23. Multiple pick-up nozzles 25 of any one of multiple types are mounted on holding body 23. Multiple pick-up nozzles 25 (e.g., 16 sections, 8 sections, 4 sections, etc.) are attached to holding body 23 via nozzle holder 24, and multiple components P can be picked up at one time. Pick-up nozzles 25 are pickup members configured to pick up a component by making use of negative pressure or a vacuum and are detachably attached to mounting head 22 via corresponding nozzle holders 24.

Mounting head 22 is configured as a rotary-type working head that rotatably holds holding body 23. As shown in FIGS. 2 and 3, holding body 23 of mounting head 22 includes head main body 40 attached to X-axis slider, and engagement shaft 41 disposed below head main body 40. Holding body 23 includes rotary portion 42, which is a cylindrical member, R-axis gear 43, which is disposed below rotary portion 42, Q-axis gear 44, which is disposed above rotary portion 42, and multiple long cylindrical nozzle holders 24 to which pick-up nozzles 25 are attached at their lower ends. Head main body 40 is provided with R-axis motor 26 for rotating rotary portion 42, Q-axis motor 27 for rotating pick-up nozzle 25, and Z-axis motor 28 for moving the push-down portion 29 to raise and lower pick-up nozzle 25. The rotation axis of rotary portion 42 is referred to as the R-axis, and the rotation axis of each pick-up nozzle 25 is referred to as a Q-axis. Engagement shaft 41 is rotatably disposed in head main body 40 and is inserted into a bottomed hole, formed at the center of Q-axis gear 44, to engage with holding body 23. Rotary portion 42 is, for example, a cylindrical member configured to rotate about the center axis of nozzle holders 24 and support multiple nozzle holders 24 in an up-down movable manner. R-axis gear 43 is a disk-shaped member having an outer diameter larger than the diameter of rotary portion 42, with gear grooves formed on the outer peripheral surface, R-axis gear 43 engages with small gear 45 connected to the rotation shaft of R-axis motor 26 and is rotationally driven by R-axis motor 26 via small gear 45. Q-axis gear 44 is a cylindrical member having an outer diameter smaller than the diameter of rotary portion 42, with gear grooves formed on the outer peripheral surface. Nozzle holder 24 is a member in which small gear 46 is disposed on the upper end and pick-up nozzle 25 is attached to the lower end. Small gear 46 engages with gear grooves on the outer periphery of Q-axis gear 44. Nozzle holders 24 are arranged at equal intervals along the outer periphery of Q-axis gear 44. Nozzle holder 24 rotates about its rotation axis (Q-axis) by the driving force of Q-axis motor 27 transmitted through small gear 47, connected to Q-axis motor 27, Q-axis gear 44, and small gear 46, disposed on the upper end of each nozzle holder 24, and the angle of the picked up component P can be adjusted. In mounting head 22, all nozzle holders 24 rotate in synchronization with the rotation of Q-axis gear 44. Nozzle holder 24 is moved up and down in the Z-axis direction by the driving force of Z-axis motor 28 transmitted through push-down portion 29. In mounting head 22, nozzle holder 24 is lifted and lowered in the Z-axis direction at two positions (see FIG. 3): first lifting/lowering position A located at the left end and second lifting/lowering position B located at the right end in the X-axis direction, That is, mounting head 22 has two lowered positions for lowering pick-up nozzles 25. Mounting head 22 can pick up multiple components P from component supply section 14 in the same step with multiple pick-up nozzles 25. It should be noted that "in the same step" means, for example, a step in which mounting head 22 picks up one or more components P, arranges (and discards) components P, and moves to the next pickup position.

As shown in FIG. 1, mounting control section 30 is configured as a microprocessor with CPU 31 at its center as a control section and includes storage section 32 for storing various data. Mounting control section 30 outputs control signals to board processing section 12, component supply section 14, component imaging section 16, and mounting section 20, and receives signals from mounting section 20, component supply section 14, and component imaging section 16. Storage section 32 stores mounting condition information 33 including the order of picking up and releasing components P, component types (ID), pick-up nozzles 25 to be used, positioning coordinates, and information on whether holding at a lowered position is necessary. Since mounting condition information 33 is acquired from management PC 50 and stored in storage section 32, the content is the same as the content of mounting condition information 55 of management PC 50 (see FIG. 4).

Management PC 50 is a computer that manages data of each device of mounting system 10. As shown in FIG. 1, management PC 50 includes control device 51, storage section 53, a display, and an inputting device. Control device 51 is configured as a microprocessor with CPU 52 at its center serving as a control section. Storage section 53 is a device, such as an HDD, for storing various data such as a processing program. The display is a liquid crystal screen for displaying various types of information. The input device includes a keyboard, a mouse, and the like through which an operator inputs various commands. Storage section 53 stores component information 54 and mounting condition information 55. As shown in FIG. 4, component information 54 is information linked to the component type (ID), and includes various information, such as the size and type of the component handled by mounting device 11, the type of pick-up nozzle for being available, and information on necessity of holding a component at a lowered position. Mounting condition information 55 is a mounting job used for the mounting process of component P and includes content equivalent to the content of mounting condition information 33 described above.

Figure 5:
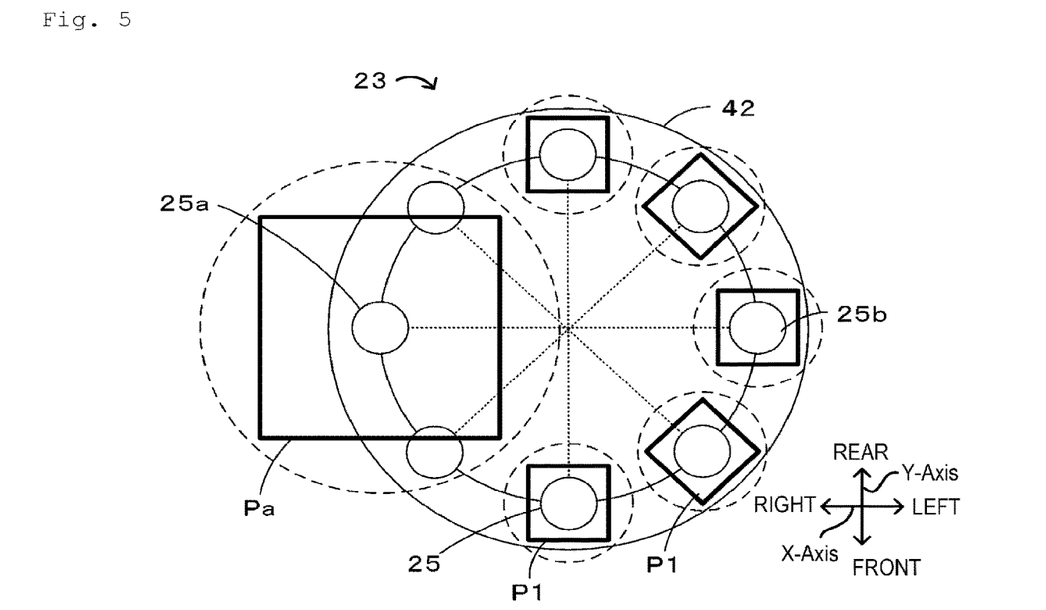
FIG. 5 A diagram showing an example of picking up general-purpose component P1 and large-sized component Pa.
Figure 6:
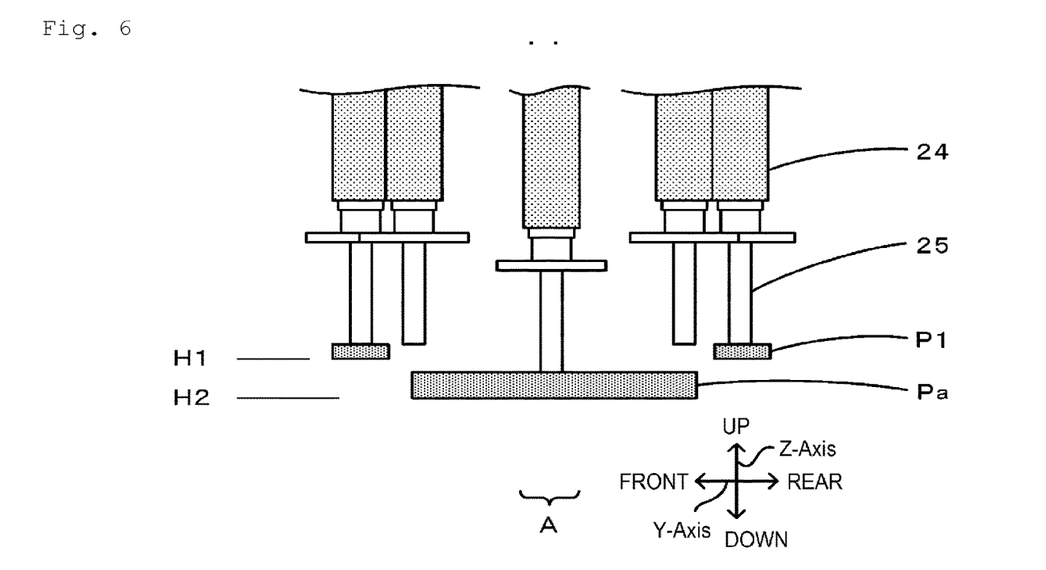
FIG. 6 A diagram showing the holding of large-sized component Pa at a lowered position with pick-up nozzle 25.

Next, the operation of mounting system 10 of the present embodiment configured as described above, in particular, the state in which mounting head 22 holds components P will be described. FIG. 5 is a diagram showing an example in which general-purpose component P1 and large-sized component Pa are picked up. FIG. 6 is a diagram showing pick-up nozzles 25 holding general-purpose component P1 at reference height H1 (a predetermined height), which is a reference height for holding components P in a normal manner, and large-sized component Pa at lowered position H2. Mounting device 11 performs, with mounting head 22, a process of picking up general-purpose component P1 (first component) and large-sized component Pa (second component) in the same step and positioning them on board S. Here, general-purpose component P1 and large-sized component Pa are collectively referred to as components P, Reference height H1 and lowered position H2 may be, for example, determined empirically to have heights that do not interfere with other members while components P are held. General-purpose component P1 has, for example, a size and a shape that does not interfere with adjacent pick-up nozzles 25 or components P while general-purpose component P1 is being picked up by pick-up nozzle 25. In mounting head 22, all of components P being held rotate synchronously about the central axis of the pick-up nozzles 25. Therefore, in mounting head 22, as shown by the dotted circle in FIG. 5, care is taken so that each component does not interfere with rotation regions obtained by adding a predetermined margin to the component size of each component. Large-sized component Pa is, for example, a component having a size that interferes with the tip of adjacent pick-up nozzle 25 and/or component P held at the tip of adjacent pick-up nozzle 25 when large-sized component Pa is picked up by pick-up nozzle 25 and held at reference height Hi. As shown in FIG. 6, large-sized component Pa is set as a lowered-position held component held at lowered position H2 lower than reference height H1, and information of "necessary" is given to lowered-position held of component information 54 (see FIG. 4). In the mounting device, large-sized component Pa was not held in the same step as general-purpose component P1, but in mounting device 11, as many components P as possible are held in the same step.

Figure 7:
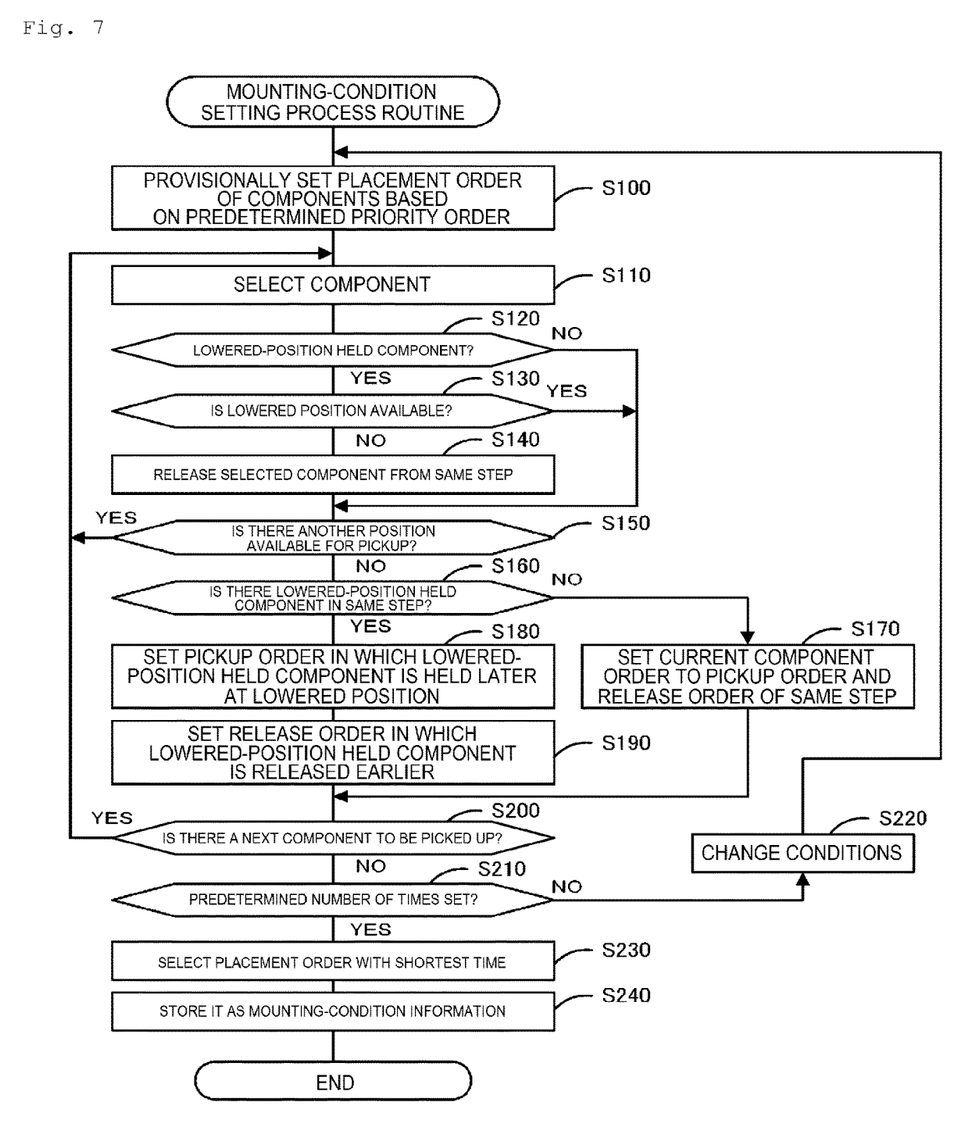
FIG. 7 A flowchart showing an example of a mounting-condition setting process routine.

Next, the operation of mounting system 10 of the present embodiment configured as described above, in particular, the process of picking up components P and setting the placement order of components P in management PC 50 will be described. Here, details of the operation is described in view of a case where eight pick-up nozzles 25 can be attached to mounting head 22, and lowered position at which component P can be picked up is "Position 2". FIG. 7 is a flowchart showing an example of a mounting-condition setting process routine executed by CPU 52 of management PC 50. This routine is stored in storage section 53 and executed based on an operator's mounting-condition creation start input. When this routine is started, CPU 52 first acquires information on components P mounted on board S by mounting device 11 and provisionally sets the placement order of components P based on a predetermined priority order (S100). For example, CPU 52 may specify components P from information of board S to be produced, such as CAD data, and acquire information for each component P. Further, the predetermined priority order may be determined by prioritizing one or more of the followings based on experience, such as multiple components P that can be simultaneously picked up, components P which result in a shorter moving distance of mounting head 22, components P yielding a smaller number of exchanges of pick-up nozzles 25, and the like.

Figure 8A:
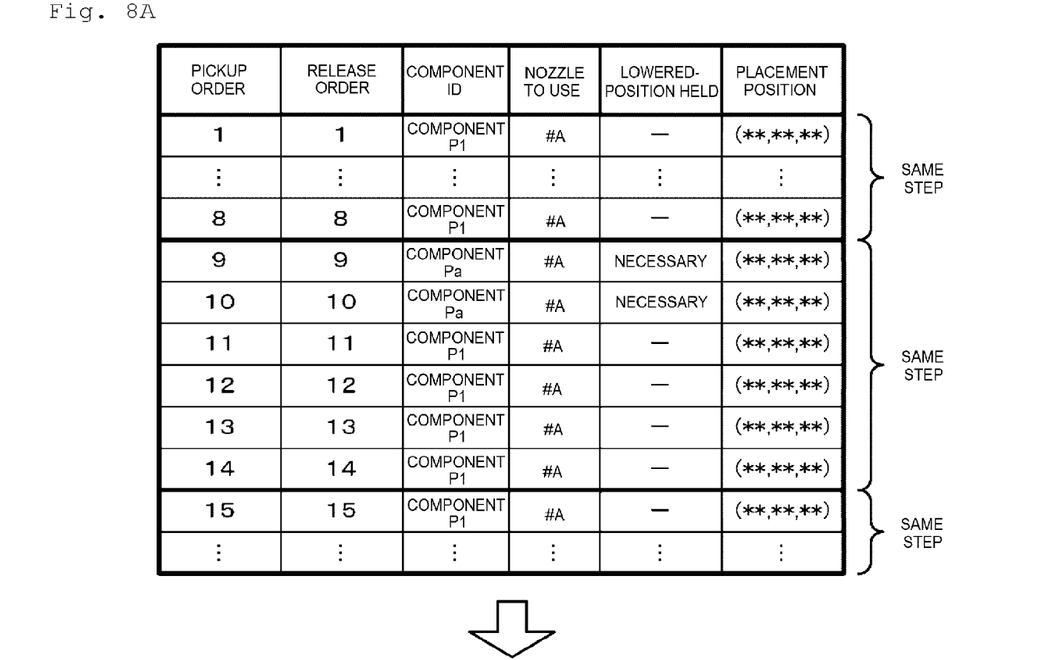
FIG. 8 A figure showing an example of changing the order of picking up and releasing large-sized component Pa.
Figure 8B:
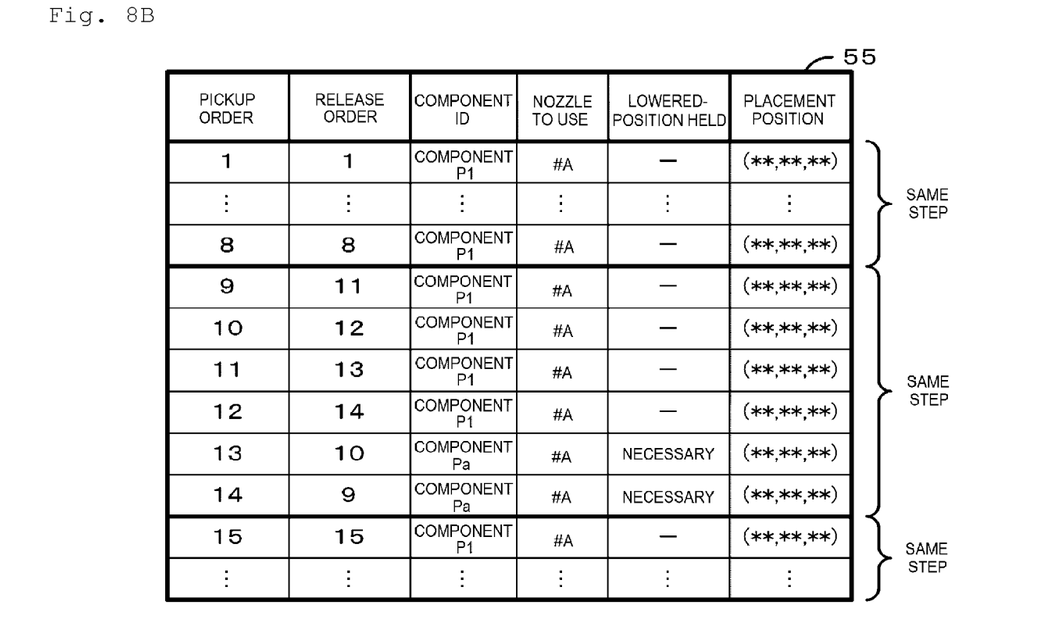

Next, CPU 52 selects component P in order from the top of the provisionally set placement order (S110), and determines whether the selected component P is a lowered-position held component (S120). CPU 52 determines whether the component is a lowered-position held component based on the lowered-position held information included in component information 54. If selected component P is not a lowered-position held component, CPU 52 determines whether pick-up nozzle 25 at another position is available to pick up the component in the same step (S150), and if a pick-up nozzle is available to pick up the component, executes S110 and subsequent processes. That is, the components are selected until there is no pick-up nozzle 25 available to perform a pick up, and the maximum number of components P that can be picked up in the same step is set. When the step includes large-sized component Pa, components P cannot be held by the two adjacent pick-up nozzles 25 (see FIG. 5), in which case, CPU 52 determines that the maximum number of pick-up nozzles 25 that can be picked up is 6. On the other hand, when component P is a lowered-position held component in S120, CPU 52 determines whether a lowered position is available (S130). In mounting head 22, the lowered position is "Position 2", and two pick-up nozzles 25a, 25b can be lowered at the same time. This determination is made so as not to set lowered-position held components exceeding the number of lowered positions in the same step. When a lowered position is available, CPU 52 performs S150 and subsequent processes. On the other hand, when a lowered position is not available, CPU 52 removes the selected component from the same step, performs a process of incorporating the selected component into a later step (S140), and performs the process of S150 and subsequent processes, When other positions are not available in S150, CPU 52 determines that the number of components that can be held in the same step is maximized, and performs a process of changing the pickup and pickup-release order in the same step as required (S160 to S190). FIG. 8 is a figure showing an example of changing the order of picking up and releasing large-sized component Pa, FIG. 8A is a table showing a provisionally set initial order of picking up and releasing large-sized component Pa, and FIG. 8B is a table showing the order of picking up and releasing after the change in the order. In this process, CPU 52 determines whether there is a lowered-position held component among the selected components P (S160), and when there is no lowered-position held component, CPU 52 sets the current component order as same as the order of picking up and releasing in the same step. For example, since the pickup order 1 to 8 in FIG. 8 does not include the lowered-position held component, in this step, the pickup order and the pickup-release order are determined without change (FIG. 8B). On the other hand, when there is a lowered-position held component among the selected components P, the order is changed to an order which makes such a lowered-position held component to be held later with the lowered position, and thereby the pickup order is set (S180). For example, since the pickup order 9 to 14 in FIG. 8A includes large-sized component Pa, large-sized component Pa is changed to a later pickup order (FIG. 8B). In mounting head 22, only first lifting/lowering position A and second lifting/lowering position B can be lowered to the lowered position, and when large-sized component Pa is picked up prior to other components P, rotary portion 42 cannot be rotated. Here, since large component Pa is picked up later, it is possible to pick up another component P. When the number of lowered-position held components is smaller than the number of lowered positions, in accordance with the available lowered positions, CPU 52 may assume an order in which the lowered-position held components are picked up by the lowered positions at the final order position, or assume an order in which the lowered-position held components are picked up at the second from the final order position.

After S180, CPU 52 changes to an order in which the lowering-position held component is released earlier and sets the pickup-release order (S190). For example, since the pickup order 9 to 14 in FIG. 8A includes large-sized component Pa, the pickup-release order of large-sized component Pa is changed to an earlier order position (FIG. 8B). In mounting head 22, when pick-up nozzle 25 is lowered to the lowered position, rotary portion 42 cannot be rotated. Here, since the lowered-position held component is released earlier, it becomes possible to release another component P. When the number of lowered-position held components held is smaller than the number of lowered positions, CPU 52, in accordance with the availabilities, may make a pickup-release order in which the lowered-position held components are released first or make a pickup-release order in which the lowered-position held components are released second from the beginning.

After S190 or after S170, CPU 52 determines whether there is a next component P to be picked up (S200), and when there is a next component P to be picked up, that is, when there is a next step, CPU 52 repeats S110 and subsequent processes. On the other hand, when there is no next component P to be picked up in S200, it is assumed that the pickup order and the pickup-release order have been set for all components P, and CPU 52 determines whether the setting of the pickup and pickup-release orders have been performed a predetermined number of times set beforehand (S210). When the setting of the pickup and pickup-release orders have not reached the predetermined number of times, CPU 52 changes the setting conditions of the pickup and pickup-release order (S220), and repeats S100 and subsequent processes. As a change of the setting condition, for example, CPU 52 may exchange the placement order of any component P. When S210 sets the placement order a predetermined number of times, CPU 52 selects the shortest one of the set pickup and pickup-release orders (S230), stores the selected pickup and pickup-release orders as mounting-condition information in storage section 53 (S240), and ends the routine as is. In this manner, mounting-condition information 55 that causes mounting head 22 to hold large-sized component Pa together with as many other components P as possible is created. Mounting device 11 acquires mounting condition information 55 before executing the mounting process, stores mounting condition information 55 in storage section 32 as mounting condition information 33, and uses mounting condition information 55 for the mounting process.

Figure 9:
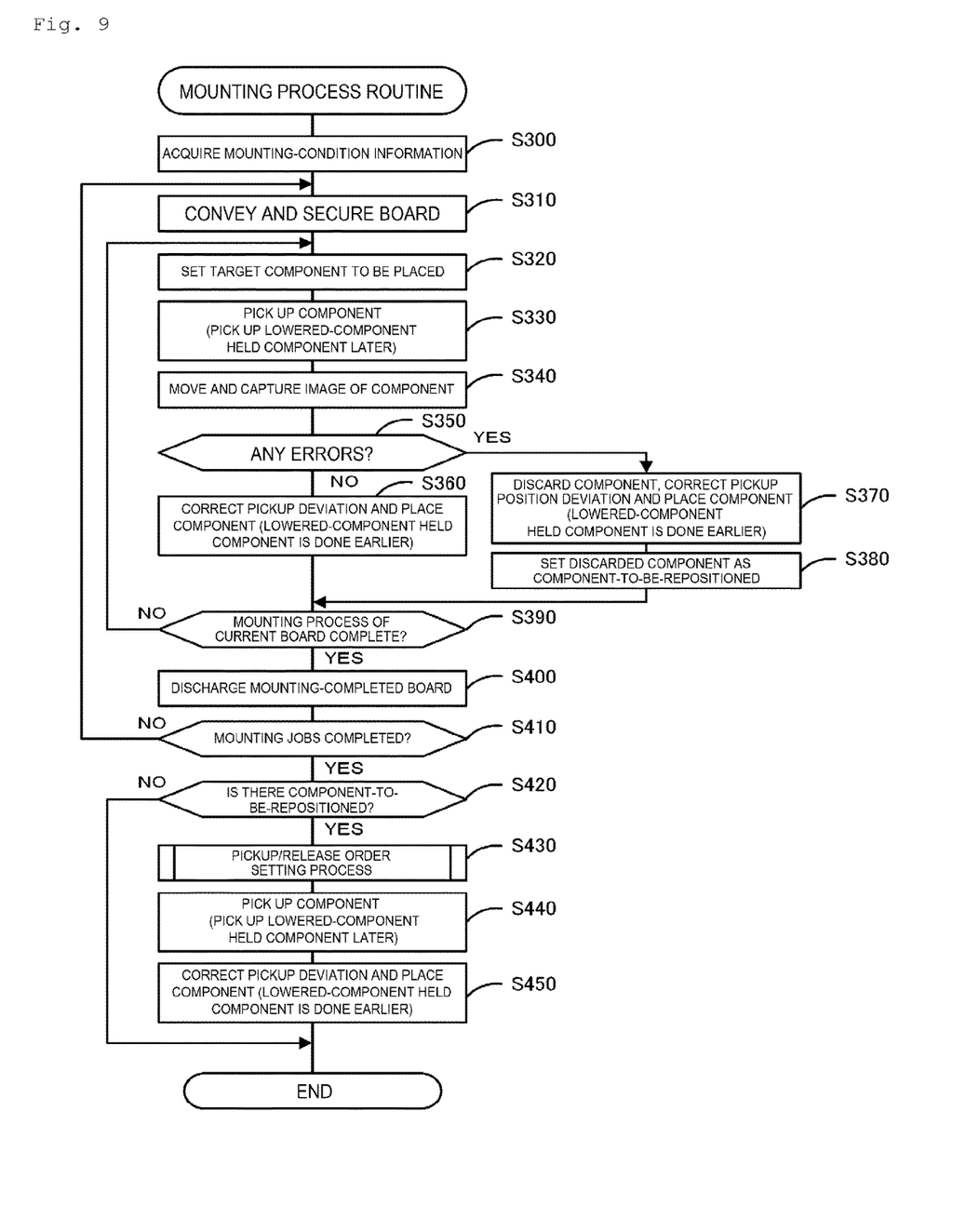
FIG. 9 A flowchart showing an example of a mounting process routine.

Next, the mounting process executed by mounting device 11 using the created mounting-condition information will be described. FIG. 9 is a flowchart showing an example of a mounting process executed by CPU 31 of mounting device 11. This routine is stored in storage section 32 and executed based on an operator's mounting start input. When this routine is started, CPU 31 first reads out and acquires mounting-condition information 33 (S300), and causes board processing section 12 to perform the conveyance and securing process on board S (S310). Next, CPU 31 sets component P to be picked up based on the pickup order of mounting-condition information 33 (S320). Here, it is assumed that CPU 31 sets one or more components P to be picked up in the same step. Next, CPU 31 attaches or exchanges pick-up nozzles 25 as required, and performs a pickup process of component P (S330). At this time, if the lowered-position held component is included in the same step, CPU 31 picks up the lowered-position held component later. Then, CPU 31 moves component P so that mounting head 22 passes over component imaging section 16 and causes component imaging section 16 to image held component P (S340).

Next, by using the captured image, CPU 31 determines whether there are errors in component P held by mounting head 22 (S350). Examples of errors in component P include shape abnormalities, a pickup position deviation outside an allowable range, and the like. When there are no errors in held component P, CPU 31 corrects the pickup position deviation to release component P and position component P on board S (S360). At this time, when the lowered-position held component is included in the same step, CPU 31 releases the lowered-position held component earlier. On the other hand, when there is an error in held component P in S350, CPU 31 discards the erroneous component at a predetermined discarding position, corrects the pickup position deviation with respect to the remaining component P and releases component P to place component P on board S (S370). At this time, when the lowered-position held component is included in the same step, CPU 31 releases the lowered-position held component earlier. CPU 31 changes the target coordinates of the placement position in mounting-condition information 33, and when the lowered-position held component is an erroneous component, CPU 31 releases the erroneous component at the discarding position earlier, and when the lowered-position held component is not an erroneous component, CPU 31 releases the erroneous component at the placement position on board S earlier. Subsequently, CPU 31 sets the discarded component P as a component-to-be-repositioned (S380).

After S360 or after S380, CPU 31 determines whether the mounting process of the current board has been completed (S390), and if not, executes S320 and subsequent processes. That is, CPU 31 sets component P to be picked up next, exchanges pick-up nozzles 25 as required, images component P. corrects the deviation, and positions component P on board S. On the other hand, when the mounting process of the current board is completed in S390, CPU 31 causes board processing section 12 to discharge board S on which mounting has been completed (S400), and determines whether the mounting jobs of the predetermined mounting-condition information 33 have been completed (S410). When the mounting jobs of mounting-condition information 33 are not completed, CPU 31 executes S310 and subsequent processes. When mounting jobs of mounting-condition information 33 are completed, CPU 31 determines whether there is a component-to-be-repositioned (S420), and when there is no component-to-be-repositioned, the routine is ended as is.

On the other hand, when there is a component-to-be-repositioned in 5420, the pickup and pickup-release order setting process is executed for one or more components-to-be-repositioned (S430). This process may be the execution of S100 to S190 of the mounting-condition setting process routine. That is, CPU 31 provisionally sets the placement order on the basis of the moving distances of mounting head 22 and the like, and sets the pickup order and the pickup-release order as they are when there are no lowered-position held components in the same step. On the other hand, when there is a lowered-position held component in the same step, CPU 31 picks up the lowered-position held component later, and sets the pickup order and the pickup-release order for releasing the lowered-position held component earlier. CPU 31 then performs the pickup process of the component-to-be-repositioned (S440), corrects the pickup deviation and releases the component-to-be-repositioned to place the component-to-be-repositioned on board S (S450), and ends the routine. In performing the processes of S440, S450, CPU 31 may perform the processes of the above S340~S380, As described above, mounting device 11 can hold large-sized member Pa together with general-purpose component P1 at the same time and perform the mounting process.

Here, the correspondence between the constituent elements of the present embodiment and the constituent elements of the present disclosure will be specified. Mounting head 22 of the present embodiment corresponds to the mounting head of the present disclosure, mounting control section 30 corresponds to the mounting control section, and control device 51 corresponds to the setting control section. In the present embodiment, an example of the mounting method and the information processing method of the present disclosure is also specified by describing the operations of mounting control section 30 and control device 51.

In mounting device 11 of the present embodiment described above, when the mounting head picks up general-purpose component P1 (first component) held by mounting head 22 at reference height H1 and large-sized component Pa (second component) held by mounting head 22 at lowered position H2 lower than reference height H1 the second component is picked up later, and when component P is released from mounting head 22 that has picked up the first component and the second component, the second component is released earlier. In mounting device 11, since the second component is held at lowered position H2, it is possible to prevent interference with adjacent pick-up nozzle 25, component P picked up by adjacent pick-up nozzle 25, or the like. Therefore, for example, the first component and the second component can be held and moved in the same step. Further, picking up the second component first may interfere with picking up the first component, but here, since the second component is picked up after the first component, the first component and the second component can be picked up without interference. Similarly, picking up a nearby first component while second component is held may cause interference with the second component, but here, since the second component is released preferentially, the first component and the second component can be released without interference. As described above, in mounting device 11, since the first component and the second component can be picked up, held, and released without interference, the production efficiency can be further improved.

Mounting head 22 is a rotary head having a rotary portion 42 (cylindrical portion) that rotates on an axis, and pick-up nozzles 25 are attached on the circumference within rotary portion 42, and picks up and releases components P while rotating rotary portion 42. Mounting control section 30 does not rotate rotary portion 42 after the second component is picked up, but rotates rotary portion 42 after the second component is released. Therefore, in mounting device 11, since rotary portion 42 is not rotated while holding the second component, component P is held more reliably. Further, mounting head 22 has two or more lowered positions to which pick-up nozzle 25 is lowered, and mounting control section 30 causes pick-up nozzle 25 of the lowered position to pick up the second component at the end of the same step in which mounting head 22 is caused to pick up multiple components P, and mounting control section 30 causes pick-up nozzles 25 at the lowered position to release components earlier starting from the second component held at lowered position H2. In mounting device 11, since multiple lowered positions can be effectively utilized, the production efficiency can be further improved. Furthermore, mounting control section 30 causes pick-up nozzle 25 at the lower position to pick up the second component, and then causes pick-up nozzle 25 at the other lower position to pick up the second component when picking up the other second component. In mounting device 11, since multiple second components can be picked up, the production efficiency can be further improved.

Further, for he component-to-be-repositioned or the like, mounting control section 30 sets the pickup order in which a second component is picked up by pick-up nozzle 25 after a first component, and sets the pickup-release order in which a second component is picked by pick-up nozzle 25 before a first component. In mounting device 11, the pickup order and the pickup-release order can be set, for example, even when a change in the mounting order becomes necessary later, the first component and the second component can be mixed and then picked up and released, thereby making it possible to further improve production efficiency. Furthermore, the second component is a large-sized component that interferes with the tip of adjacent pick-up nozzle 25 and/or a first component held at the tip of adjacent pick-up nozzle 25 when a second component is picked up by pick-up nozzle 25 and held at reference height H1 In mounting device 11, production efficiency can be further improved when a large-sized component is involved.

It should be noted that the mounting device and the information processing device of the present disclosure are not limited to the embodiments described above, and may be implemented in various modes as long as they fall within the technical scope of the present disclosure.

For example, in the embodiment described above, mounting head 22 has rotary portion 42, but is not particularly limited thereto as long as mounting head 22 holds component P at lowered position H2 and need not have rotary portion 42. Further, although mounting head 22 has two lowered positions, the present disclosure is not particularly limited thereto, and mounting head 22 may have three or more lowered positions or may have only one lowered position. Further, mounting head 22 has been described as rotating all nozzle holders 24 at the same time, but the present disclosure is not particularly limited thereto, and nozzle holders 24 may be configured to rotate individually.

In the embodiment described above, mounting device 11 and management PC 50 set the pickup order and the pickup-release order, but the present disclosure is not particularly limited thereto, and any one of the devices may set the pickup order and any one of the devices may set the pickup-release order. Also in this mounting system 10, it is possible to obtain the same effect as in the above-described embodiment.

In the embodiment described above, large-sized component Pa is used as the lowered-position held component, but the present disclosure is not particularly limited thereto as long as it is a component that needs to be held at the lowered position. Although general-purpose component P1 is the first component, it may be a special component as long as it can be held at reference height H1.

In the embodiment described above, pick-up nozzle 25 has been described as a pickup member, but the present disclosure is not particularly limited thereto as long as the pickup member picks up component P, and the pickup member may be, for example, a mechanical chuck that grasps and picks up component P.

In the mounting device of the present disclosure, the mounting head is a rotary head having a cylindrical portion that rotates on an axis with the pickup members being attached to the circumference of the cylindrical portion, and is configured to pick up and release components while the cylindrical portion is rotated; and the mounting control section does not rotate the cylindrical portion after picking up the second component but rotates the cylindrical portion after releasing the second component. In this mounting device, since the cylindrical portion is not rotated while holding the second component in the rotary head, the component can be held more reliably.

In the mounting device of the present disclosure, the mounting head may have two or more lowered positions to which the pickup member is lowered; and the mounting control section causes the pickup member of the lowered position to pick up the second component at the end of the same step in which the mounting head is caused to pick up multiple components, and the mounting control section causes pickup members at the lowered position to release components earlier starting from the second component at the lowered position. Since multiple lowered positions can be effectively utilized with this mounting device, the production efficiency can be further improved. Here, "in the same step" means, for example, a step in which the mounting head picks up one or more components, and then positions (and discards) the components and move to the next pickup position.

In the mounting device of the present disclosure, the mounting head may have two or more lowered positions for lowering the pickup member, and when, after picking up the second component with the pickup member at the lowered position, the mounting control section picks up another second component, the mounting control section may pick up said second component with the pickup member of another lowered position. Since multiple second components can be picked up with this mounting device, the production efficiency can be further improved.

In the mounting device of the present disclosure, the mounting control section may set a pickup order in which the pickup member picks up the second component after the first component, and set a pickup-release order in which the second component is released from the pickup member before the first component. In this mounting device, the pickup order and the pickup-release order can be set, for example, even when a change in the mounting order becomes necessary later, the first component and the second component can be mixed and then picked up and released, thereby making it possible to improve the production efficiency.

In the mounting device of the present disclosure, the second component may be a large-sized component that interferes with the tip of an adjacent pickup member and/or the first component held by the tip of the adjacent pickup member when picked up by a pickup member and held at a predetermined height. In this mounting device, the production efficiency can be further improved in the case where a large-sized component is involved.

The information processing device of the present disclosure is an information processing device for use in a mounting system comprising a mounting device provided with a mounting head having multiple pickup members configured to pick up a component: the mounting device being configured to pick up and perform a mounting process on the components: the information processing device comprising: a setting control section configured to set a pickup order for picking up a second component later when a first component held by the mounting head at a predetermined height and a second component held by the mounting head at a lowered position lower than the predetermined height are picked up by the mounting head; and the setting control section is configured to set a pickup-release order for releasing the second component earlier when a component is released from the mounting head in which the first component and the second component are held.

This information processing device can pick up, hold, and release the first component and the second component without interference, and can hold and move the first component and the second component in the same step, thereby making it possible to further improve the production efficiency, similarly to the mounting device described above. In this information processing device, various modes of the mounting device described above may be adopted, or a configuration for achieving each function of the mounting device described above may be added.

The mounting method of the present disclosure is a mounting method for use in a mounting device provided with a mounting head having multiple pickup members configured to pick up components, the mounting device being configured to pick up and perform a mounting process on the components; the mounting method comprising: (a) a step of picking up a second component later when the mounting head picks up a first component held at a predetermined height and the second component held at a lowered position lower than a predetermined height, and (b) a step of releasing the second component earlier when a component is released from the mounting head having picked up the first component and the second component.

In this mounting method, similarly to the mounting device described above, the first component and the second component can be picked up, held, and released without interference, and the first component and the second component can be held and moved in the same step, making it possible to further improve the production efficiency. In this mounting method, various aspects of the mounting device described above may be adopted, or steps for achieving each function of the mounting device described above may be added.

The information processing method of the present disclosure is an information processing method used in a mounting system comprising a mounting device provided with a mounting head having multiple pickup members configured to pick up components; the information processing method comprising (a) a step of setting a pickup order for picking up a second component later when the mounting head picks up a first component held by the mounting head at a predetermined height and the second component held by the mounting head at a lowered position lower than the predetermined height, and (b) a step of setting a pickup-release order for releasing the second component earlier when a component is released from the mounting head having picked up the first component and the second component.

In this information processing method, similarly to the information processing device described above, the first component and the second component can be picked up, held, and released without interference, and the first component and the second component can be held and moved in the same step, thereby making it possible to further improve the production efficiency. In this information processing method, various aspects of the information processing device described above may be adopted, or steps for achieving the functions of the information processing device described above may be added.

INDUSTRIAL APPLICABILITY

The present disclosure can be applied to the technical field of a device configured to perform a mounting process of picking up and positioning a component.

REFERENCE SIGNS LIST

10 Mounting system, 11 Mounting device, 12 Board processing portion, 14 Component supply portion, 15 Feeder, 16 Component imaging portion, 18 Nozzle storage section, 20 Mounting section, 21 Head moving portion, 22 Mounting Head, 23 Holder, 24 Nozzle holder, 25 Pick-up nozzle, 26 R-axis motor, 27 Q-axis motor, 28 Z-axis motor, 29 Push-down portion, 30 Mounting control section, 31 CPU, 32 Storage section, 33 Mounting condition information, 40 Head main body, 41 Engagement shaft, 42 Rotary portion, 43 R-axis gear, 44 Q-axis gear, 45-47 Small gear, 50 Management PC, 51 Control device, 52 CPU, 53 Storage section, 54 Component information, 55 Mounting condition information, A First lifting/lowering position, B Second lifting/lowering position, P component, P1 General-purpose component, Pa Large-sized component, S Board, H1 Reference height, H2 lowered position.

The invention claimed is:

1. A mounting device comprising:
    a mounting head including a cylindrical portion that rotates on an axis and multiple pickup members attached to a circumference of the cylindrical portion and configured to pick up and release components as the cylindrical portion is rotated;
    a mounting control section configured to
        when a first component is held by the mounting head at a predetermined height, cause a second component to be picked up later and to be held by the mounting head at a lowered position lower than the predetermined height,
        cause the second component to be released earlier than the first component, when the mounting head releases the components, and
        cause the cylindrical portion to not rotate after picking up the second component and to rotate the cylindrical portion after releasing the second component.

2. The mounting device of claim 1, wherein the mounting head has two or more lowered positions to which at least one pickup member of the pickup members is lowered; and the mounting control section causes the at least one pickup member of the lowered position to pick up the second component at an end of a same step in which the mounting head is caused to pick up multiple components, and the mounting control section causes the at least one pickup member at the lowered position to release the components earlier starting from the second component held at the lowered position.

3. The mounting device of claim 1, wherein the mounting head has two or more lowered positions to which the pickup members are lowered, and the mounting control section, after picking up the second component with a first pickup member at the lowered position, picks up another component with a second pickup member at another lowered position.

4. The mounting device of claim 1, wherein the mounting control section sets a pickup order in which the second component is picked up by the mounting head after the first component, and the mounting control section sets a pickup-release order in which the second component is released from the mounting head before the first component.

5. The mounting device of claim 1, wherein the second component is a large-sized component that interferes with a tip of an adjacent pickup member and/or the first component held at the tip of an adjacent member when the second component is picked up by a pickup member and held at the predetermined height.

6. An information processing device used in a mounting system comprising a mounting device provided with a mounting head including a cylindrical portion that rotates on an axis and multiple pickup members attached to a circumference of the cylindrical portion and configured to pick up and release components as the cylindrical portion is rotated; the mounting device being configured to pick up and perform a mounting process; and
    the information processing device comprises a setting control section configured to
        set a pickup order for picking up a second component later than a first component, held by the mounting head at a predetermined height, the second component being held by the mounting head at a lowered position lower than the predetermined height;
        set a pickup-release order for releasing the second component earlier than the first component when the mounting head releases the components; and
        cause the cylindrical portion to not rotate after picking up the second component and to rotate the cylindrical portion after releasing the second component.

7. A mounting method for use in a mounting device provided with a mounting head including a cylindrical portion that rotates on an axis and multiple pickup members attached to a circumference of the cylindrical portion and configured to pick up and release components as the cylindrical portion is rotated, the mounting device being configured to pick up and perform a mounting process on the components, the mounting method comprising:
    (a) a step of picking up a second component later than a first component held at a predetermined height by the mounting head, the second component being held at a lowered position lower than the predetermined height;

(b) a step of releasing the second component earlier than the first component when the mounting head releases the components; and (c) a step of causing the cylindrical portion to not rotate after picking up the second component and to rotate the cylindrical portion after releasing the second component.

8. An information processing method for use in a mounting system comprising a mounting device provided with a mounting head including a cylindrical portion that rotates on an axis and multiple pickup members attached to a circumference of the cylindrical portion and configured to pick up and release components as the cylindrical portion is rotated, the information processing method comprising:

(a) a step of setting a pickup order for picking up a second component later than a first component held by the mounting head at a predetermined height, the second component being held by the mounting head at a lowered position lower than the predetermined height;

(b) a step of setting a pickup-release order for releasing the second component earlier than the first component when the mounting head releases the components a component; and (c) a step of causing the cylindrical portion to not rotate after picking up the second component and to rotate the cylindrical portion after releasing the second component.

* * * * *